United States Patent [19]

Downing

[11] Patent Number: 5,764,403
[45] Date of Patent: Jun. 9, 1998

[54] PANEL DISPLAY USING TWO-FREQUENCY UPCONVERSION FLUORESCENCE

[76] Inventor: Elizabeth A. Downing, 630 Los Robles #7, Palo Alto, Calif. 94306

[21] Appl. No.: 791,686

[22] Filed: Jan. 30, 1997

Related U.S. Application Data

[63] Continuation-in-part of Ser. No. 435,062, May 8, 1995, Pat. No. 5,684,621.
[51] Int. Cl.[6] .............................. G02F 1/35; G11C 13/04
[52] U.S. Cl. ...................... 359/326; 365/151; 501/123; 501/126; 501/904
[58] Field of Search ........................ 359/326–332; 372/6, 39–42; 365/151; 501/40, 50, 64, 78, 101, 123, 126, 904–906

[56] References Cited

U.S. PATENT DOCUMENTS

| | | | |
|---|---|---|---|
| 3,922,061 | 11/1975 | Glass et al. | 359/326 X |
| 4,471,470 | 9/1984 | Swainson et al. | 365/127 |
| 5,003,179 | 3/1991 | Pollack | 250/483.1 |
| 5,022,040 | 6/1991 | Pollack et al. | 372/41 X |
| 5,245,623 | 9/1993 | McFarlane | 372/69 |
| 5,268,862 | 12/1993 | Rentzepis | 365/151 |
| 5,309,452 | 5/1994 | Ohishi et al. | 372/6 |
| 5,378,664 | 1/1995 | Becker et al. | 501/40 |
| 5,388,110 | 2/1995 | Snitzer | 372/6 |
| 5,472,759 | 12/1995 | Chen et al. | 428/65.1 |
| 5,684,621 | 11/1997 | Downing | 359/326 |

OTHER PUBLICATIONS

Glanz, J., *Three–Dimensional Images Are Conjured in a Crystal Cube*, Science, vol. 273, p. 1172, Aug. 30, 1996.
Szuromi, P., *3D Displays*, Science, vol. 273, p. 1149, Aug. 30, 1996.
Downing, E. et al, *A Three–Color, Solid State, Three–Dimensional Display*, Science, vol. 273, pp. 1185–1189, Aug. 30, 1996.

*Primary Examiner*—John D. Lee
*Attorney, Agent, or Firm*—Lumen Intellectual Property Services

[57] ABSTRACT

A real-time, multi-color image [36] is displayed in a flat screen [20] composed of a low-phonon, optically transparent, non-pixelated host material doped with active ions. The display uses intersecting infrared laser beams [22, 24] of different wavelengths to induce a two-frequency upconversion process in the active ions at a point [28] in the screen. When the ions relax, visible fluorescence is produced. Different points in the display are activated by directing the laser beams [22, 24] to intersect at different locations within the screen. In one embodiment, beams from two lasers [28, 30] are controlled by single axis mirrors [32, 34]. In other embodiments, laser arrays or slab lasers are used to activate points within the screen. Through the use of additional lasers and dopants, multi-color images may be displayed. The doped host material is tailored to provide efficient upconversion in the region of intersection, with minimal visible light generated outside this region by either one of the infrared beams alone. Typical media are rare-earth-doped glasses or crystals having low phonon energies. The general methods for selecting and producing the display material, along with a plurality of system configurations for addressing the display, are disclosed.

52 Claims, 12 Drawing Sheets

PANEL DISPLAY USING TWO-FREQUENCY UPCONVERSION FLUORESCENCE

RELATED APPLICATIONS

This application is a continuation-in-part of U.S. patent application Ser. No. 08/435,062 filed May 8, 1995, U.S. Pat. No. 5,684,621, which is incorporated herein by reference.

FIELD OF THE INVENTION

The present invention relates generally to devices and methods for the dynamic display of visual information and, more particularly, to displays using two-photon two-frequency upconversion fluorescence in an optically transparent panel for the display of 2-dimensional images.

BACKGROUND OF THE INVENTION

One common type of panel display is based on polarization properties of liquid crystals, implanted in small (250 μm×250 μm) pixels, which are controlled by individual transistors. When a voltage is applied to a cell, the liquid crystals are rotated to either transmit or block light of a particular polarization. These devices are complicated and expensive to manufacture, have narrow angular viewing ranges, and suffer from low brightness. In addition, because most light is unpolarized, the devices have low extinction and penetration ratios.

Panel displays based on other principles, such as the electro-fluorescence of phosphor, are also known. These displays are also complicated and expensive to manufacture. In addition, many of these techniques still suffer at present from high power consumption and low brightness. Moreover, most prior art panel displays generally are restricted to planar or flat geometries and can not easily be adapted to curved or wrap-around display applications. In addition, these displays are typically opaque, which prohibits their use in applications requiring a transparent display screen.

Slava A. Pollack, in U.S. Pat. No. 5,003,179 issued Mar. 26, 1991, discloses a display technique using photons to induce upconversion and fluorescence in a screen. Ross A. McFarlane, in U.S. Pat. No. 5,245,623 issued Sep. 14, 1993, discloses a similar device. In both patents, a laser beam is directed toward a display screen at an angle roughly normal to the screen surface, in much the same way that an electron beam is directed toward a phosphor screen in a conventional CRT. At the point where the laser beam impinges upon the surface of the screen, the photons cause single-frequency upconversion in the material of the screen. The resulting fluorescence produces a visible point on the screen. The disclosed devices, however, are not flat panel devices. Moreover, it is not even possible to use the techniques disclosed in these patents to produce an effectively flat device. In particular, because the techniques are based upon single frequency upconversion, any laser beam directed through the plane of the screen would produce an entire line, and it would not be possible to independently control the fluorescence of single points in the screen. As a result, the laser beam must be directed at the screen from a location outside the plane of the screen, thereby forcing the device to have a substantial depth.

Elizabeth Downing, in parent U.S. patent application Ser. No. 08/435,062, discloses a three-dimensional display based upon a two-frequency upconversion fluorescence process in a low-phonon optically transparent host material doped with rare earth ions. Generally, two-frequency absorption is a well known process in which two distinct photons of different energies are absorbed by an ion or molecule, causing excitation from the ground state to a higher energy state. (For details, see, for example, Downing et al., *Science*, 273, 1185, Aug. 30, 1996). The excitation pathway can involve either a real or virtual intermediate energy state. The former case is referred to as a resonant two-frequency absorption process because the two photons must have frequencies that match the energy level differences of the ion. The excitation pathway is therefore gated in the sense that two specific frequencies are required for the ion to attain the excited state and consequently fluoresce. Because the intermediate state is real, the resonant two-frequency process permits the photons to be absorbed consecutively, provided the second absorption follows the first in a time interval less than the relaxation time of the intermediate state. The excitation via a virtual intermediate state, in contrast, requires that the photons be absorbed simultaneously but does not require that their frequencies separately match specific energy level differences in the ion. In either case, however, the ion or molecule remains in the upper excited state for a short time, commonly known as the excited state lifetime, after which it relaxes back to the ground state, giving up the excess energy in the form of phonons (referred to as nonradiative relaxation) or photons (referred to as radiative relaxation, leading to upconversion fluorescence or possibly stimulated emission).

Prior to Downing, displays based on two-frequency induced fluorescence failed to satisfy certain requirements for a successful implementation of this technique. For example, the host material must be selected such that radiative relaxation must dominate over nonradiative relaxation in order to obtain a sufficient quantum efficiency, and moreover, the two infrared photons must derive from separate sources with distinctly different wavelengths so that visible fluorescence occurs only in those regions of the host material where the beams from the separate sources intersect. In addition, to ensure that visible fluorescence is generated only in the region of pump beam overlap, single-frequency upconversion of either of the individual infrared pump beams must be minimized through appropriate dopant concentrations and scanning speeds; otherwise, visible "streaking" of the pump beams will be apparent. Although the methods, devices, and materials disclosed by Downing overcome these and other problems associated with prior art display devices, specific techniques for adapting the invention to two-dimensional or panel displays were not disclosed.

SUMMARY OF THE INVENTION

Accordingly, it is an object of the present invention to provide a method and system for the two-dimensional display of information based on two-frequency upconversion fluorescence. The display comprises an appropriate optical host doped with one or more active ions or molecules to enable conversion of infrared radiation to visible light by two-frequency upconversion. In contrast with prior art techniques based upon single-frequency upconversion, an aspect of the present invention provides for complete flat panel implementation since the pump lasers are launched directly into the plane of the display screen from the edges. In this way individual pixels are addressed at specific locations within the plane of the display by appropriate control of beam position, without the need to pixelate the screen with embedded wires or transistors. Images are formed in the host material by rapidly scanning or otherwise manipulating the pump beams, which are invisible to the eye, so as to activate the appropriate pixels comprising the images. Another aspect of the invention relates to the use of laser diodes, laser diode arrays, micro-scanners, and suitable upconversion materials for use in two-dimensional displays.

In another aspect, the present invention pertains to a panel display technology that is emissive, and does not rely on reflected or transmitted light. In addition, the display screen is transparent, providing see-through viewing when needed. In an alternate embodiment where transparency is not desired, the display is backed with an opaque or reflective material. This panel display concept is non-pixelated providing extreme manufacturing ease and cost reduction over current embodiments. Finally, this display concept permits two-dimensional displays whose screens are either flat or curved in any number of ways.

Another aspect of the invention relates to applications for solid-state panel display systems including small scale lenses for goggles, visors, and heads-up displays where uninterrupted visual access to an external field of view is necessary. Instrument panel covers, windows and windshields, and even artwork are also applications for this type of display.

An aspect of the invention includes a method for the two-dimensional display of information using two-frequency upconversion of near-infrared radiation to address pixels inside one or more transparent sheets of material that have been doped with one or more types of active ions or molecules. The near-infrared radiation takes the form of two intersecting laser beams or multiple sets of intersecting beam pairs. A pixel is formed at each intersection region and has a spatial extent determined by the size of the two focused infrared pump beams in their region of overlap. Typically a pixel has a linear dimension, measured along any side, in the range from 50 μm to 1 mm.

The two beams comprising each intersecting pair of pump beams have separate wavelengths that are tuned or selected to provide for two-frequency absorption by the active ion or molecule that is embedded in the host material. The gated absorption results in visible fluorescence at an addressable pixel location. Once activated, a pixel acts as a point source of visible fluorescent light and can be viewed from any direction. An image is formed by activating the appropriate set of pixels, analogous to the way in which an image is displayed on a cathode ray tube by activating a collection of phosphorescent pixels. In contrast to a cathode ray tube, however, the present invention permits the activation beams to be directed within the plane of the display screen rather than normal to the screen surface. Consequently, the present invention allows the complete display to be implemented in two dimensions.

A pixel will emit light for the entire time that both pump beams are present in its location. After the pump lasers have been turned off or have moved to another pixel location, the previously activated pixel will continue to emit light for a period equal to the lifetime of the excited state of the active ion or molecule. This characteristic energy decay time allows many thousands of pixels to be turned on by only a few pairs of pump lasers which are rapidly scanned throughout the display. In this way, multiple pixels are turned on during a single frame time segment to form an image inside the panel. The object or scene being displayed can be transformed in time (i.e., translated, rotated, scaled, skewed, etc.) or otherwise altered to depict motion.

The present invention discloses three general energy level configurations for optimal two-frequency upconversion with minimal single-frequency upconversion. One configuration corresponds to single-species doping while the other two correspond to multi-species doping. In the single-species case, efficient upconversion to one or more colors is obtained, in part, by having a intermediate state of appropriate lifetime that is strongly coupled to the upper pump-excited state. Transitions from the upper pump-excited state to lower-lying levels provides for efficient visible fluorescence. In the first case of dual-species doping, population that is left in the intermediate level after the pump laser has passed is rapidly returned to the ground state via phonon-assisted energy transfer to prevent the occurrence of ghost pixels. In the second case of codoping, multiple ions or molecules are combined in a single host material and wavelength multiplexing is used to address different colors in different ions.

As with the three-dimensional display disclosed by Downing in the parent application, to obtain sufficient upconversion efficiency the active ion or molecule is doped into a host material that is characterized by a wide transparency range, from the visible through the far infrared, and by low phonon energies, having wave numbers of less than 500 $cm^{-1}$. Low phonon energies are needed to minimize nonradiative relaxation which competes with the desired fluorescence. Low-phonon energy materials typically have extended transparency into the far infrared because absorption of far-infrared radiation arises from the conversion of the radiation energy into phonons.

The present invention identifies several classes of host materials that are suitable for upconversion displays. These include (1) the heavy metal halide glasses based on zirconium, hafnium, indium, zinc, and other heavy metals, (2) chalcogenide materials, in particular those based on sulfides of the 3rd and 4th group elements of the periodic table, and (3) low-phonon alkali-metal halide crystals such as NaCl, KCl, KBr, CsBr, and CsI, (4) nano-structured composite materials consisting of low-cost, light-weight, and potentially higher phonon energy primary materials which have been impregnated with high efficiency crystals (some materials of this type may have phonon energies with wave numbers above 3000 $cm^{-1}$), (5) nano-phase materials such as glass ceramics which have been cast and then post-processed to induce localized phase transitions on a micro-level to improve performance of the active ions, and (6) doped hydrogen free or aprotic polymers that have lower vibrational energies than standard polymers.

A number of different material systems (i.e., host plus dopant, or doped material or material system) are disclosed. These include Pr-doped, Tm-doped, Er-doped, Ho-doped and Er/Yb, Er/Sm, Er/Tb, and Er/Eu codoped heavy metal halide glasses. Pumping is preferably carried out with compact laser diodes and high speed scanners. Multiple color fluorescent emission is obtained by the use of different dopants in different layers which have been appropriately lamented together, or by appropriate mixing of more than one dopant in a single layers, or by wavelength addressing of different colors in a single ion.

Several schemes for producing and controlling individual colors are described. These include: (1) wavelength multiplexing in which more than one wavelength pair is used to select a specific color in either a single dopant ion or in a codoped system, (2) layered monolithic structures comprising a fundamental set of thin layers corresponding to primary colors (e.g., red, green, and blue), each layer containing a unique dopant or combination of dopants tailored to fluoresce at one of the primary colors; and (3) the use of an active external color filter that transmits specific wavelengths from a set of multiple fluorescent wavelengths that are produced by the upconversion process in a single ion species.

The present invention further provides a plurality of systems for addressing the upconversion display. These include scanning multiple laser beam pairs in parallel (by using, for example, linear diode laser arrays). Alternatively, diode lasers and diode-pumped solid-state lasers can be used in combination with conventional deflective scanning technologies (such as mechanically or galvanometrically driven mirrors, or acousto-optical deflectors) to rapidly direct the pump radiation into the display plane to draw images. In addition, an array of micro-mechanical mirrors may be used for high-speed deflection of several sets of pump beams in parallel. Yet another approach involves the use of linear arrays of independently addressable laser diodes that are focused (either statically or dynamically using, for example, micro-lens arrays) and appropriately modulated, thereby turning on a large number of pixels simultaneously without the need for beam deflection.

Other features and advantages of the present invention will become apparent from the following detailed description, taken in conjunction with the accompanying drawings, which illustrate, by way of example, the principles of the invention.

DETAILED DESCRIPTION OF THE PREFERRED EMBODIMENTS

A. Gated Two-Frequency Upconversion for Planar Information Display

The effective operation of a display according to the present invention requires that the material system satisfy two fundamental conditions. First, the active ion or molecule must be capable of undergoing a two-frequency upconversion process by absorbing two different wavelengths of infrared radiation, after which it must radiate to produce visible fluorescent light. Secondly, the active ion or molecule must be doped in a transparent host material that allows the upconversion process to occur with a useful fluorescence quantum efficiency.

Figure 1:
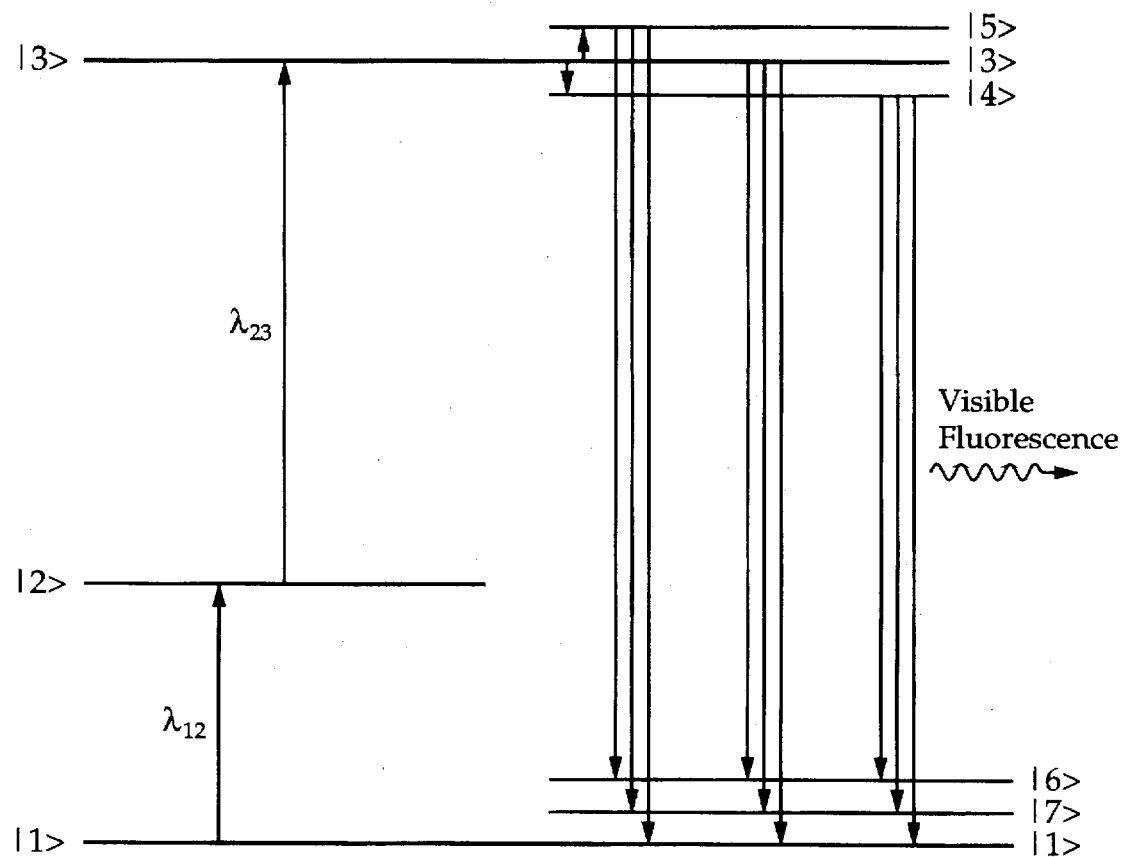
FIG. 1 is a general energy level diagram for a single dopant that is suitable for two-frequency upconversion according to the invention.

As shown in FIG. 1, two-frequency upconversion occurs when the active ion or molecule first undergoes an excitation from a ground state |1> to an intermediate excited state |2> (either real or virtual) through absorption of an infrared photon having wavelength $\lambda_{12}$. An additional excitation from the intermediate state |2> into a second, higher energy state |3> then occurs upon absorption of a second infrared photon having a different wavelength $\lambda_{23}$. Radiative relaxation from the second excited state |3> (or from a nearby level, such as |4> or |5>, that readily couples to the second excited state) back down to the ground state |1> (or to a state, such as |6> or |7>, in the vicinity of the ground state) produces the desired visible fluorescence. In this manner, two infrared photons are absorbed, and one visible photon is created for each excitation-emission process. The time sequence of events is such that the second photon at wavelength $\lambda_{23}$ can either be absorbed simultaneously with, or subsequent to, the absorption of the first photon at wavelength $\lambda_{12}$. Under continuous excitation, an individual ion or molecule can produce anywhere from a few hundred to several million visible photons per second, depending on the excitation intensity, the lifetime of the energy levels involved, and the degree to which radiationless relaxation occurs.

Figure 2:
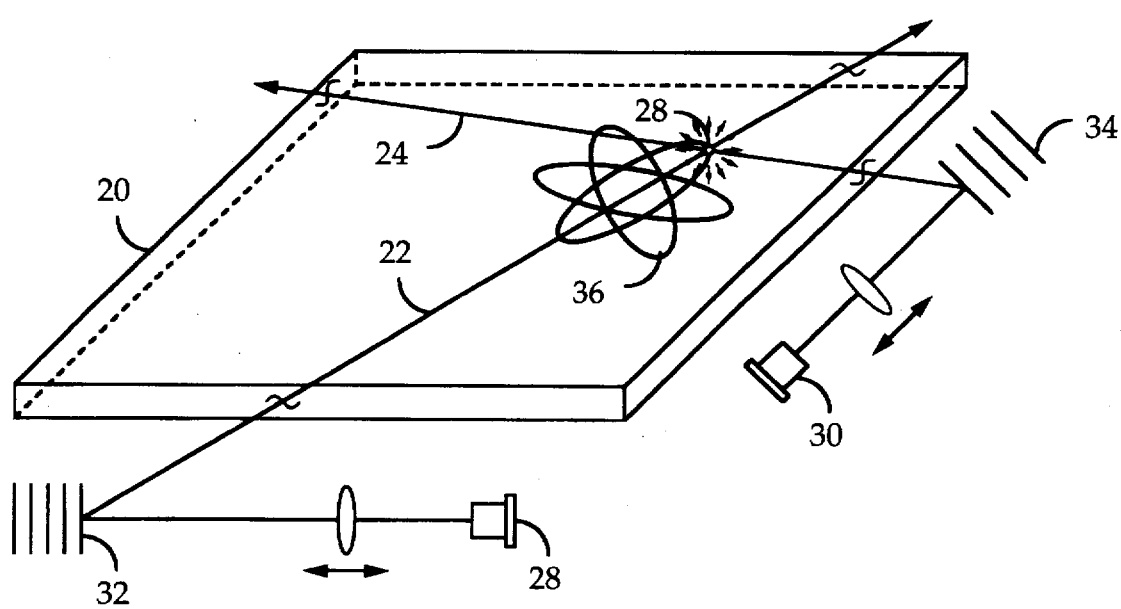
FIG. 2 illustrates a monochromatic embodiment of the invention using two scanning lasers to create images.

FIG. 2 illustrates a display according to one embodiment of the present invention. A planar screen 20 is composed of a host material doped with an active ion or molecule. Suitable hosts and dopants are discussed in detail below. A first laser beam 22 having wavelength $\lambda_{12}$ and a second laser beam 24 having wavelength $\lambda_{23}$ are directed through the edges of screen 20 and travel within the plane of the screen. In a small region 26 within the screen, beams 22 and 24 intersect and cause dopant ions in region 26 to produce visible fluorescence. By suitable choice of host materials, dopants and beam wavelengths, visible fluorescence is not produced within the screen except where the two beams intersect. Accordingly, by controlling the positions and orientations of beams 22 and 24, individual regions with the screen may be selectively caused to produce visible fluorescence. FIG. 2 shows an embodiment wherein beams 22 and 24 are produced by lasers 28 and 30, respectively, and controllably directed into screen 20 by single axis scanners 32 and 34, respectively. Scanners 32 and 34, as well as lasers 28 and 30, are controlled by a microprocessor or dedicated hardware (not shown) in order to move the region 26 where beams 22 and 24 intersect. In this manner, a visible image 36 may be produced within the display. Other methods for producing laser beams and directing them into the screen are discussed below in relation to other embodiments.

In an embodiment wherein the screen is capable of displaying dynamic images, the highest excited state lifetimes of the ion are sufficiently short (i.e., there is sufficiently strong coupling between excited and ground states), to allow entire image refresh rates at 30–60 Hz to avoid the perception of "flicker" by the viewer. This condition will allow dynamic images to be drawn without the blurring associated with long-lived persistent fluorescence. For static image display applications, the excited state lifetimes need not satisfy this requirement.

A.1. Single-Species Upconversion

One aspect of the present invention involves the identification of an energy level configuration, as shown in FIG. 1, that is applicable to a host material doped with a single species of active ion or molecule. This configuration for two-frequency upconversion provides: (1) a mechanism for excitation from a ground state |1> into an upper pump-excited state |3>, via an intermediate state |2>, by absorption of two photons having distinct wavelengths $\lambda_{12}$ and $\lambda_{23}$, (2) a multiplicity of states (e.g. |4> and |5>) in the vicinity of the upper pump-excited state |3>, to which phonon-mediated transitions can occur, (3) a multiplicity of states (e.g. |6> and |7>) in the vicinity of the ground state |1>, (4) strong radiative coupling from the uppermost excited states (e.g. |3>, |4> and |5>) to the lower lying levels (e.g. |1>, |6> and |7>), producing multi-wavelength fluorescence with high quantum efficiency, and (5) minimization of single-frequency upconversion. Therefore, this invention, in part, serves to point out new and important characteristics of the active ion or molecule that are not addressed in the prior art, and are required to construct a viable panel display based on gated two-frequency upconversion.

Although the discussion here will be restricted to atoms and ions in order to illustrate the fundamental concepts, it will be appreciated by those skilled in the art that the same concepts and principles are applicable to molecules as well. Bearing this in mind, the energy levels in FIG. 1 are identified by quantum states denoted |1>, |2>, |3>, . . . |7>, a notation which is shorthand for the more rigorous representation of the quantum state by four independent quantum numbers S, L, J, M (see, for example, L. I. Schiff, *Quantum Mechanics*, Third Edition, McGraw-Hill, 1968, p. 435). These quantum numbers correspond, respectively, to the spin, the orbital angular momentum, the total angular momentum, and the component of J along a specified axis (typically taken to be the z axis). In order to observe quantization effects related to M, there must be some way of defining the z axis in space, such as by the application of an external magnetic field. Since no external magnetic field is used in the present invention, each energy level is completely characterized by the three quantum numbers S, L, and J such that $|1>=|S_1,L_1,J_1>$, $|2>=|S_2,L_2,J_2>$, . . . $|7>=|S_7,L_7,J_7>$.

Transitions between the various levels are governed by selection rules and transition probabilities. For electric dipole transitions, which comprise the most common type of transitions involving electromagnetic radiation, the well-known selection rules require that $\Delta S=0$, $\Delta L=0$, $+1$ or $-1$, and $\Delta J=0$, $+1$, or $-1$ (P. H. Heckman and E. Trabert, *Introduction to the Spectroscopy of Atoms*, North-Holland, 1989, pg. 55). These selection rules apply strictly to free atoms and ions. When the atoms and ions are incorporated into a solid host, their quantum states are perturbed by the surrounding environment in such a way that many of the so-called "forbidden" electric dipole transitions (i.e., those transitions that do not satisfy the selection rules) actually become readily observable.

A.2. Codoping to Reduce Intermediate Level Lifetimes

Figure 3:
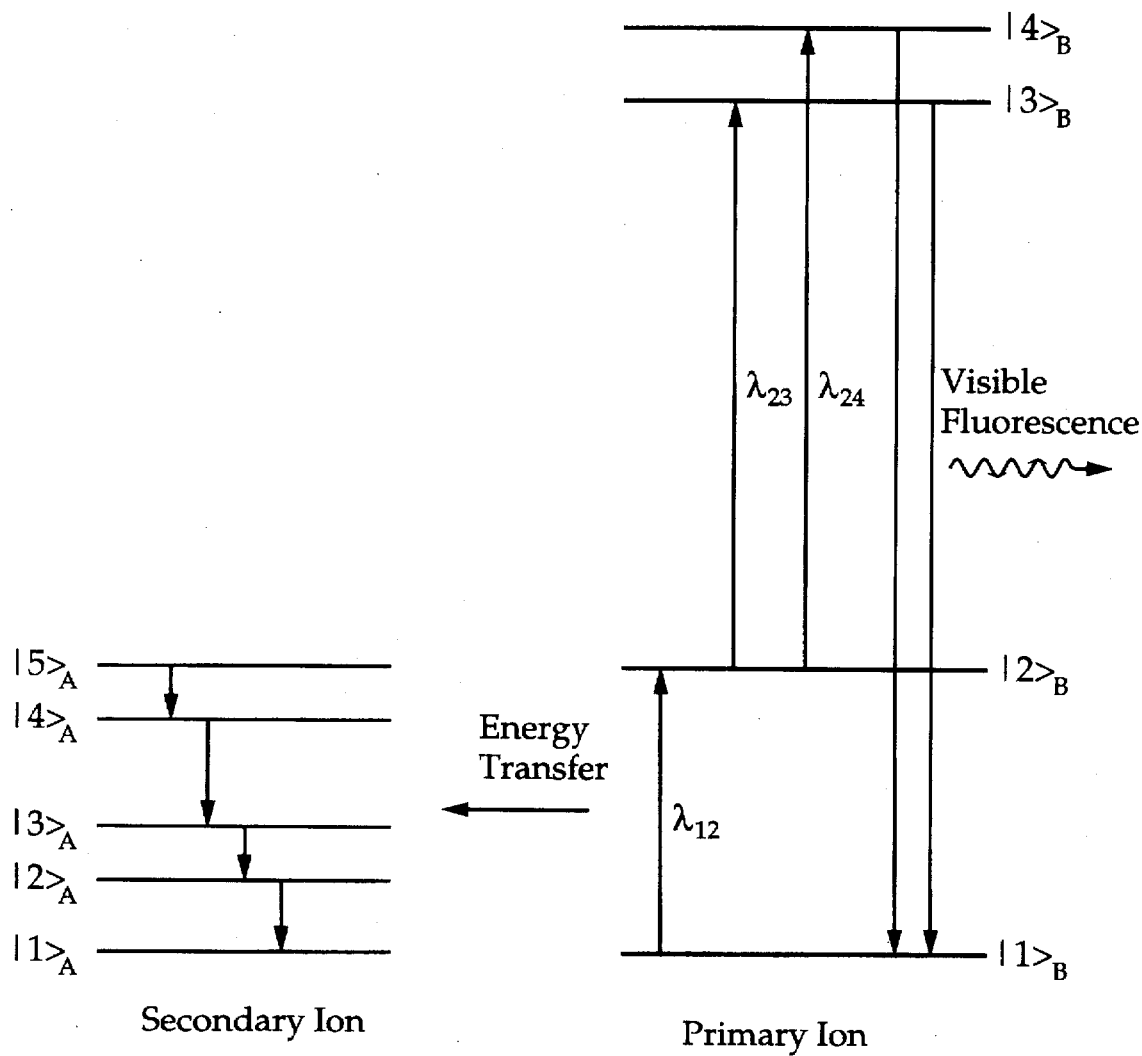
FIG. 3 depicts an inter-ion energy transfer which is used to deplete the unused population in a long-lived intermediate state of a primary ion.

While it is important to utilize low-phonon host materials to reduce non-radiative losses, this can cause very long lifetimes (i.e. lifetimes in excess of 10 ms) for intermediate states having no closely lying lower levels. In addition to doping with one type of ion or molecule, mixtures of dopants (i.e., codoping) can be used effectively to reduce the long lived intermediate level lifetime in ions like $Er^{3+}$ and $Tm^{3+}$, which cause ghost pixels under certain scanning scenarios. FIG. 3 shows how the energy contained in the intermediate state $|2>_B$ of a primary ion or molecule is transferred to a second type of ion or molecule that has a multitude of closely spaced levels $|1>_A$, $|2>_A$, $|3>_A$, $|4>_A$, $|5>_A$, beneath the primary ion's excited intermediate state. The secondary ion should be free of levels between the primary ion's intermediate state $|2>_B$ and excited states $|3>_B$ and $|4>_B$ so as not to bleed off population from the upper excited state through non-radiative relaxation. It is important to note that careful selection of the dopant concentrations is needed for the energy transfer processes to work effectively. In practice, the optimum concentrations can be determined by a systematic experimental study of the material system under investigation by one of ordinary skill in the art, using the teachings of the present invention as disclosed herein.

For the case of erbium as the primary ion, sammarium, europium, terbium, and dysprosium are suitable ions to dump excess population from the $^4I_{13/2}$ intermediate level. In addition, $Yb^{3+}$ can be used to deplete population in the $^4I_{11/2}$ level which builds up through the unwanted process of single frequency upconversion of the 1500 nm first photon pump laser wavelength. This is particularly problematic at concentrations above 1.0 mole percent and the addition of ytterbium helps to defeat this unwanted phenomenon.

A.3. Codoping to Achieve Multiple Color Operation

It is possible to mix multiple dopants into a single host and address different colors simply by using only the wavelengths necessary to excite them. Erbium and thulium can be mixed together, but the 790 nm excitation wavelength needed to address blue in thulium induces some amount of single frequency upconversion to visible green in erbium, which has an 800 nm transition. This can be prevented by carefully controlling the ratios of the dopants, and by introducing microcrystalline structure to the host which narrows the line widths and also has the beneficial effect of increasing the absorption cross sections.

B. General Properties of the Host Material for the Panel Display

Figure 4:
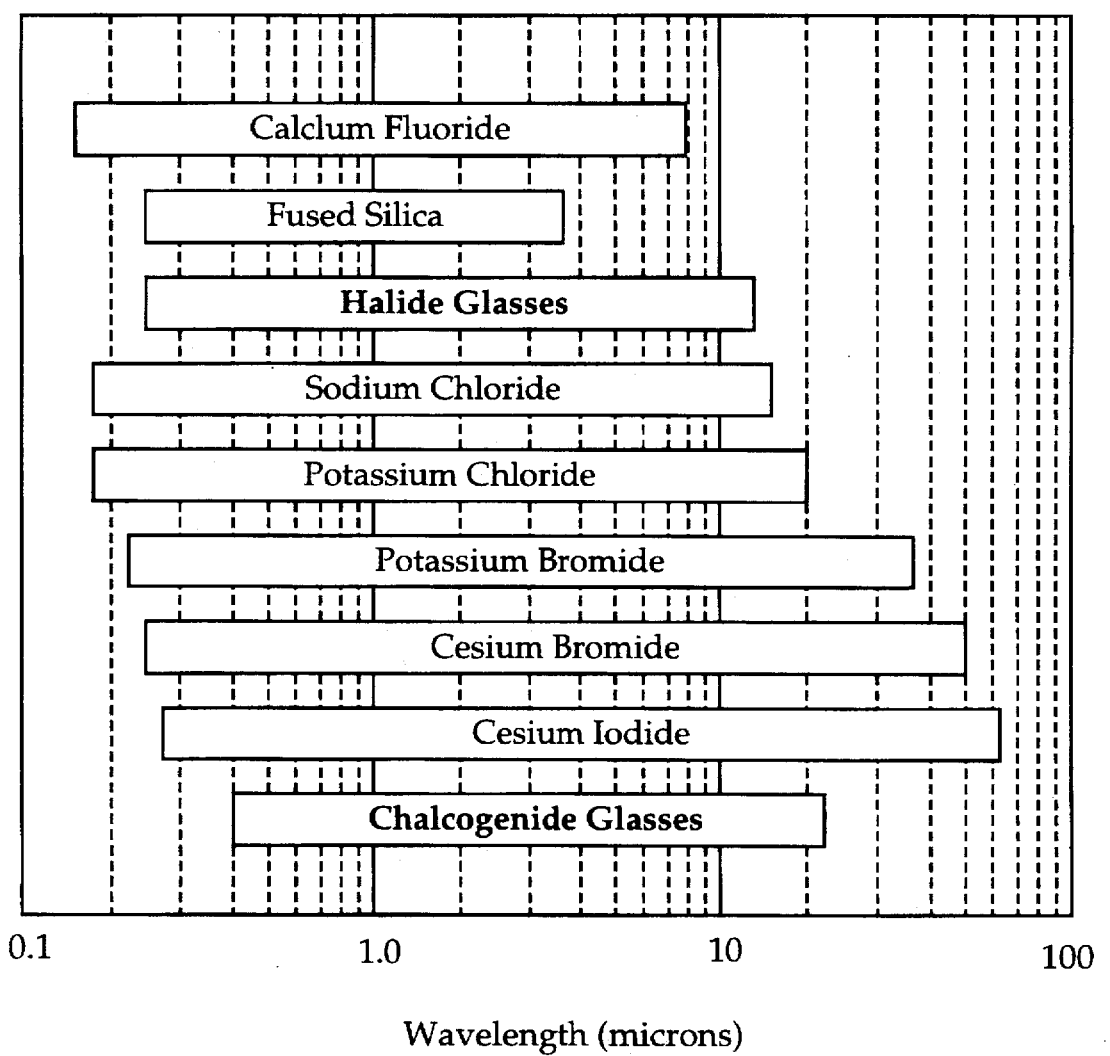
FIG. 4 shows the visible, near-infrared, and far-infrared transparency of several host materials.

The host material that immediately surrounds the dopant ion or molecule will produce a crystal field that determines the behavior of the active species. One of the primary factors governing the efficiency of the upconversion process is the range of phonon energies characteristic of the host material. Nonradiative relaxation, which occurs through the formation of phonons, or lattice vibrations, can rapidly deplete the excited-state energy levels. If sufficient energy is lost nonradiatively, even strong ground-state and excited-state absorption, combined with intense pumping, will not result in very much, if any, visible fluorescence. FIG. 4 shows the transparency range of several different potential host materials.

Figure 12:
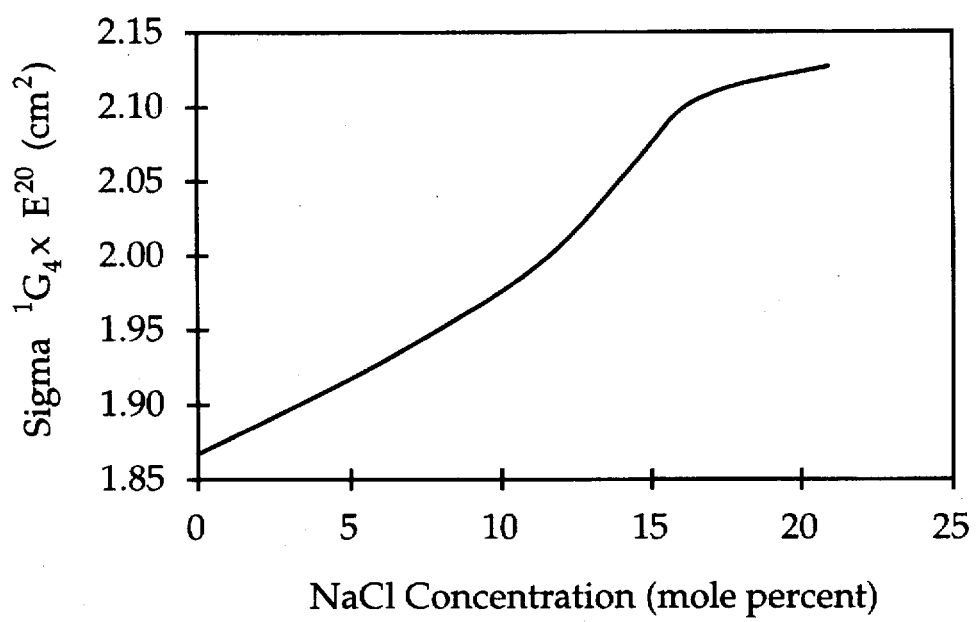
FIG. 12 is a graph of the ground state absorption cross section of $Pr^{3+}$ versus concentration of sodium chloride in ZBLN glass.

In addition to radiative emission, absorption cross section is greatly influenced by host environment and should be sufficiently high to reduce the power requirements of the pump lasers. This is particularly important for ions like $Pr^{3+}$ that exploit weakly allowed transitions. Absorption cross section of $10-24$ $cm^2$ or more are generally necessary. Chlorinating a fluoride based host can increase the absorption cross section of certain ions reducing the centrosymmetric environment. See FIG. 12.

Because only the local environment surrounding the dopant species generally limits fluorescent behavior, it is possible to impregnate lower cost, lighter weight, materials with high efficiency nano-crystals of the appropriately prepared active ion. In particular, the display screen may be produced from composite materials comprising polymers or silicate and oxide glasses that have micro- or nano-crystalline substructure resulting either from post heat processing or initial composite synthesis.

B.1. Low-Phonon Halide Glasses

Heavy-metal halide glasses, which are based on the elements zirconium, barium, hafnium, indium, zinc, cadmium, and others, were identified in the mid 1970's as a promising class of optical materials since they can be readily manufactured and possess phonon energies below those which are characteristic of other optical materials such as silicate and oxide based glasses. One such glass, ZBLAN, with a composition of 53% ZrF4, 20% BaF2, 4% LaF3, 3% AlF3, and 20% NaF has phonon energies less than 500 $cm^{-1}$ and a transparency out to 8 microns. Variations on this composition (which include anions of Cl, Br, I, and cations of other heavy metals) form glasses with yet lower phonon energies and transparencies out to 13 microns. The variation in local environment surrounding the active dopant ion or molecule caused by the many glass forming constituents acts to perturb the site symmetry of the dopant, thereby increasing radiative transition probabilities between otherwise spin-forbidden transitions. Additionally, heavy-metal halide glasses have high damage thresholds enabling the laser beams to be focused to small spot sizes. This greatly increases the display brightness and intrinsically reduces stray fluorescence that would invariably result if collimated beams were used.

B.2. Chalcogenide Materials

The chalcogenides constitute another class of glasses with far-infrared transparency beyond 20 microns. In particular, the sulfides of the third and fourth group elements on the periodic table have high transparency not only in the far infrared, but also throughout the visible region of the spectrum as well. They are also lower in density, thereby providing a lighter weight solution for large volume displays.

B.3. Low-Phonon Alkali-Metal Halide Crystals

Alkali-metal halide crystals, such as NaCl, KCl, KBr, CsBr, CsI, are also very promising host materials for efficient upconversion. As shown in FIG. 4, these crystals generally exhibit excellent transparency from below 300 nm out to 20–50 microns. They can be doped with rare earth and transition metal ions (see, for example, J. K. Radhakrishnan et al., *J. Lumin.*, Vol. 63, 1995, pp. 137–142).

B.4. Nano-Structured Composites

Crystals, such as the alkali metal halides generally have very good optical properties. The ligand field of the crystal host protects the active ions from the high phonon energy environment of polymers, even when the crystals have been ground up to nanometer sized particles. Powders of these materials can be mixed into plastics which when cured, can provide a low cost material for the display.

B.5. Nano-Phase Materials

Glasses based on $SiO_2$ are generally not good hosts for upconversion fluorescence because of the high non-radiative losses. Silicate glasses are easy to manufacture however, and can be heat treated after vitrification has occurred, to induce very localized phase transitions on a micro-crystalline level, using rare earth ions as nucleation sites. This post synthesis processing produces a crystalline field around the active ions which increases the upconversion efficiency.

B.6. Aprotic Polymers

Most polymers are based on hydrogen, oxygen, and carbon, all of which are light weight elements with high energy vibrational modes. Aprotic polymers (Lichtenson, et. al., Mat. Res. Soc. Symp. Proc. Vol. 435, 1996) belong to a class of materials that are based on silicon and have lower phonon energies than typical polymers. These materials offer a potential low cost solution for manufacturing the image plane of these displays.

C. Methods for Producing Color

C.1. Layered Structures

Figure 5A:
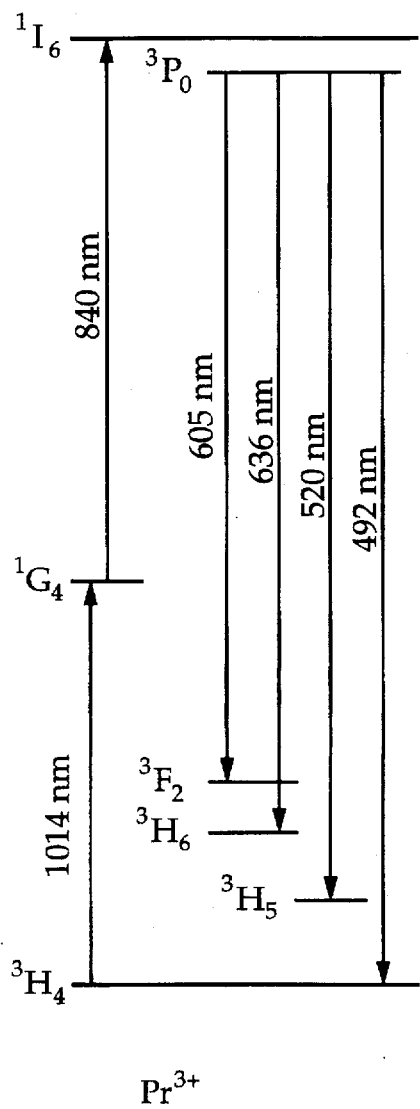
FIGS. 5A, 5B, and 5C show energy level diagrams of $Pr^{3+}$, $Er^{3+}$, and $Tm^{3+}$, respectively.
Figure 5B:
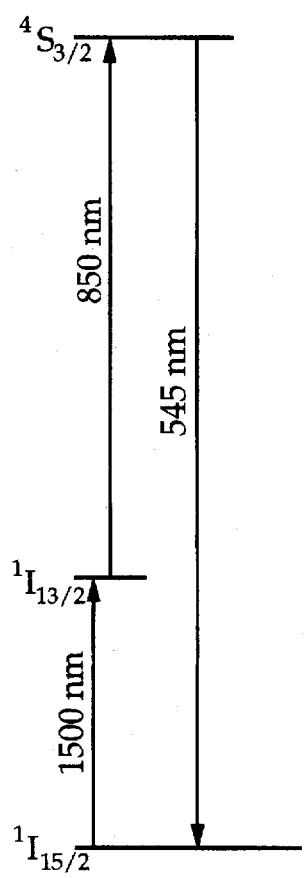
Figure 5C:
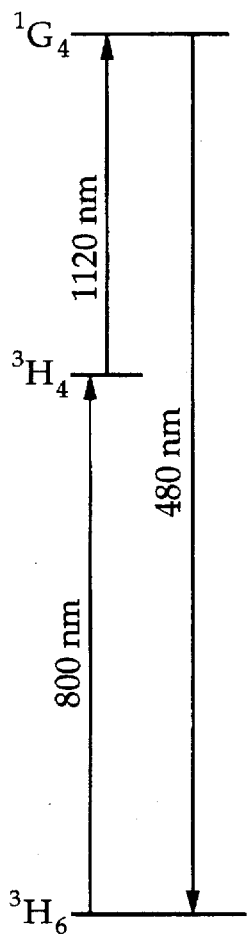
Figure 6:
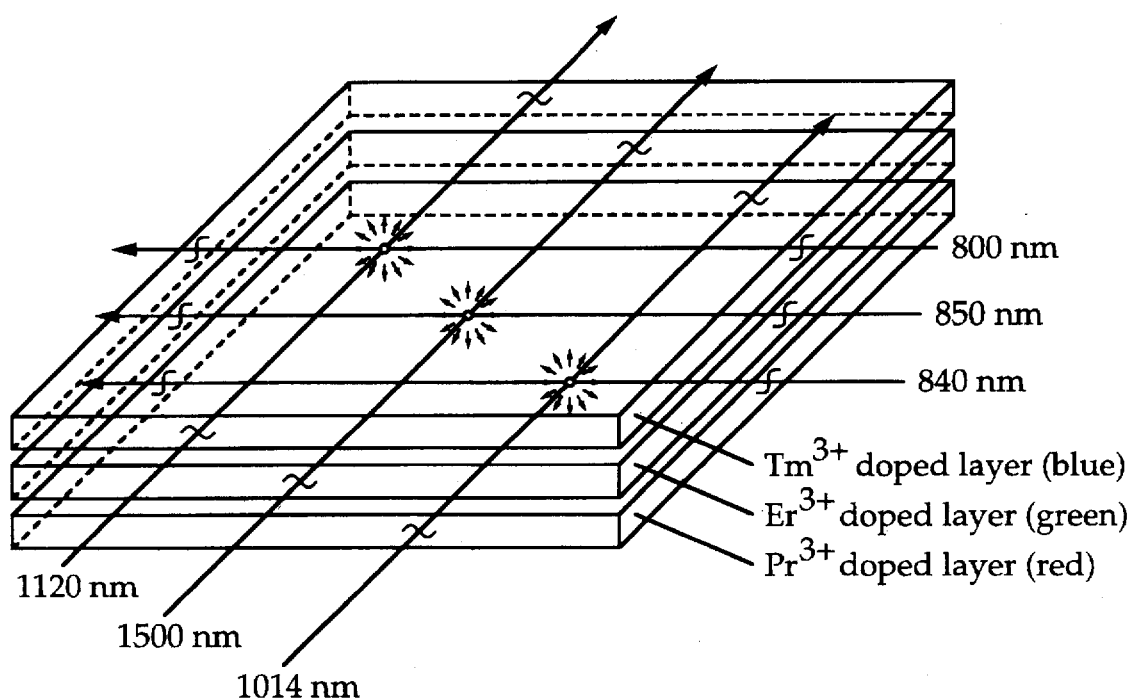
FIG. 6 depicts a three layered display architecture used to produce three primary colors.

In one embodiment of the invention, red, green, and blue colors are produced through the use of $Pr^{3+}$, $Er^{3+}$, and $Tm^{3+}$ in three isolated layers. The energy level diagrams for these ions are shown in FIGS. 5A, 5B, and 5C, respectively. FIG. 6 shows an embodiment of an RGB display whose screen comprises three differently doped layers of material. Each individual layer is designed to provide at least one color. The layers are sufficiently thin and are laminated together with an appropriate method such as index matching adhesives or thermal bonding so as to produce the appearance of a single sheet. Alternatively, these layers can be grown or sputtered onto each other with standard processing technology. Because this embodiment separates the active ions into physically separate color groups or layers, little or no unwanted interaction or "crosstalk" arises between the ions in different layers.

C.2. Wavelength Multiplexing

Figure 7:
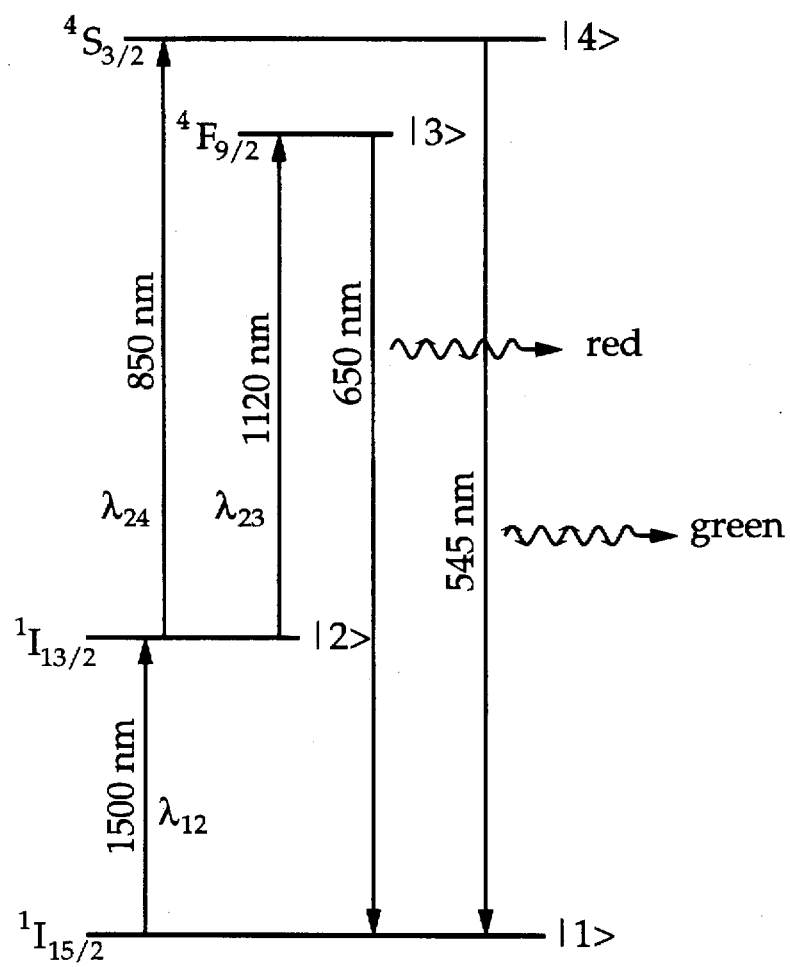
FIG. 7 is an energy level diagram of $Er^{3+}$, showing the wavelengths used to create red and green.
Figure 8:
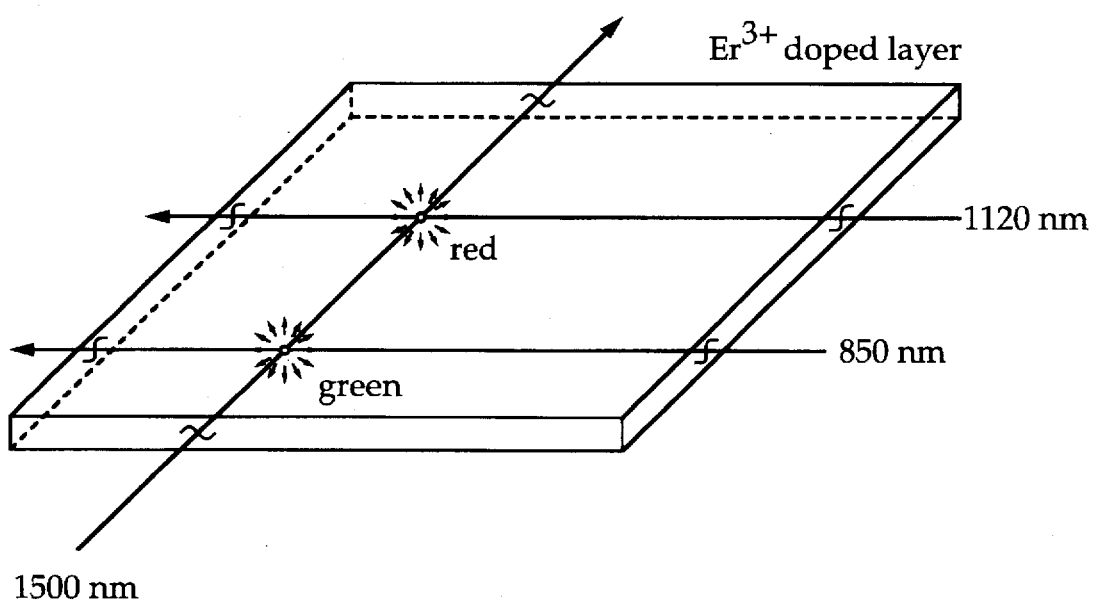
FIG. 8 depicts a single $Er^{3+}$ layer which is used produce two colors by wavelength multiplexing.

FIG. 7 shows an energy level diagram of erbium along with the pump wavelengths used to obtain both red and green emission from this single ion. A first wavelength ($\lambda_{12}$) is used to excite the intermediate level |2> independent of the color being addressed. A second wavelength ($\lambda_{23}$) is used to address one color (red), and a different second wavelength ($\lambda_{24}$) is used to excite another color (green). By multiplexing between the second wavelengths, different colors can be addressed in a singly doped layer of material, as shown in FIG. 8. Using this technique, the three layers shown in FIG. 6 may be reduced to two layers. In addition to multiplexing between wavelengths to excite different colors in a single dopant, it is also possible to mix more than one dopant in a single layer and multiplex between laser pairs to achieve addressable color.

C.3. Active External Color Filtering

Figure 9:
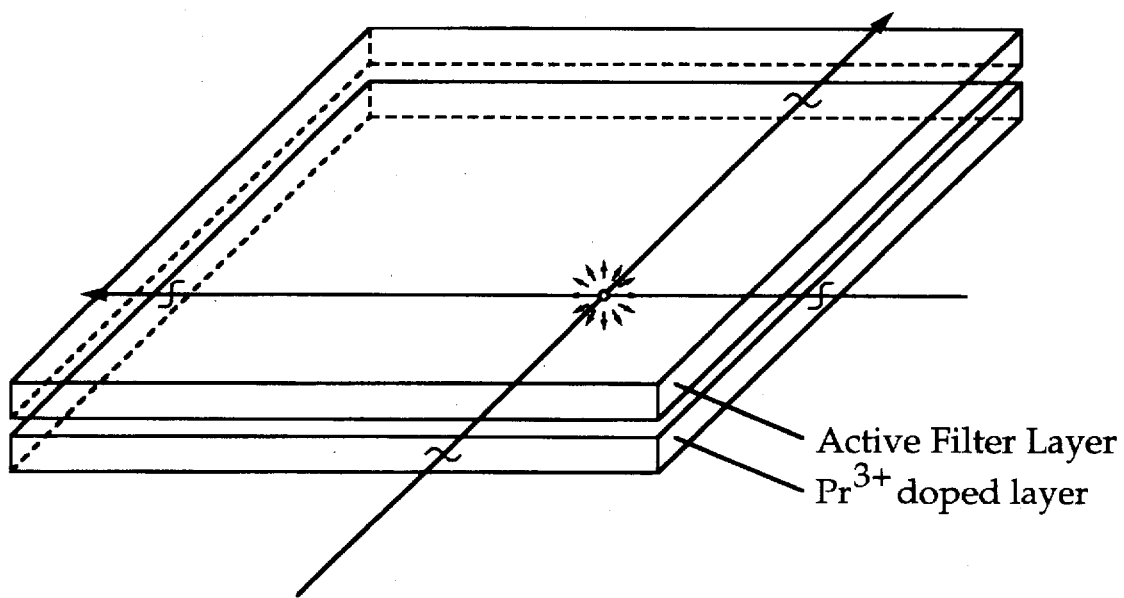
FIG. 9 depicts a single $Pr^{3+}$ layer which is used in conjunction with an active color filter to produce a multi-color display.

Another method for producing a color display, shown in FIG. 9, involves the use of an active external color filter to separate various fluorescence wavelengths that are simultaneously emitted from an upper state that decays to several lower states. An example of an ion with this behavior is praseodymium which emits wavelengths in the red, green, and blue when excited to the upper $^1I_6$ level. Such color filters, based on liquid crystal technology, are now commercially available (e.g., the RGB Color FAST Filter manufactured by DisplayTech, Boulder, Colo.). This approach is advantageous when a material system possesses an efficient multi-color upconversion process, but the individual colors can not be readily separated by wavelength or pulse-length multiplexing techniques.

D. Architectures for Addressing the Display

The two-photon, two-frequency mechanism described herein defines a method for producing a single pixel at the intersection of two different wavelength infrared laser beams. In order to draw dynamic images, the point of intersection of the pump laser beams must occur nearly simultaneously at a multitude of locations inside the display volume. As illustrated in FIG. 2, this can be accomplished by rapidly scanning the laser beams throughout the image volume in a manner that will enable all pixels contributing to the image to be refreshed at a rate sufficiently high to eliminate the appearance of "flicker" in the display. Typically this rate is between 30 Hz and 60 Hz. Various systems for obtaining high speed, high precision deflection of laser beams are commercially available and include (but are not limited to) mechanical galvanometer scanners with position feedback and acousto-optic devices, all of which are capable of operating at kilohertz frequencies with sub arc second accuracy.

A practical embodiment of this device would be "pumpable" with low power infrared laser diodes or LEDs. Laser diodes are small, light weight, and have the highest electrical to optical conversion efficiency of any lasers that are commercially available at this time. They can be thermoelectrically cooled, have current controlled output power, and require low supply voltages (2 V). In addition, they can be modulated at frequencies above a gigahertz.

Deflective scanning of multiple laser beams, coupled with appropriate on-off modulation, current control for brightness, and dynamic focusing, will enable numerous highly complex (static and dynamic) multi-color images to be drawn in this display. Many permutations of system design, with variations in the number and type of laser sources and the number of scanners can be envisioned for this purpose, the optimal system configuration depending on the size and configuration of the final device.

D.1. Multiple Beam Scanning

As illustrated in FIG. 2, one embodiment of this system would use only two pump lasers 28 and 30, one of each necessary wavelength, two single axis scanners 32 and 34 of any appropriate type, and two focusing axes. Pump laser beams 22 and 24 are individually deflected with single axis scanners, by either vector or raster scan means, to draw images.

A modification to the embodiment shown in FIG. 2 employs multiple lasers of each necessary wavelength, and multiple deflective scanning systems that would function in parallel, to achieve complex image display at lower scan rates and with lower pump laser powers. The power requirements of each laser would thus be reduced by the number of lasers working in parallel. Scanners could be coupled or controlled independently, and a single scan axis could be used for multiple lasers.

D.2. Laser Diode Array Scanning

Figure 10:
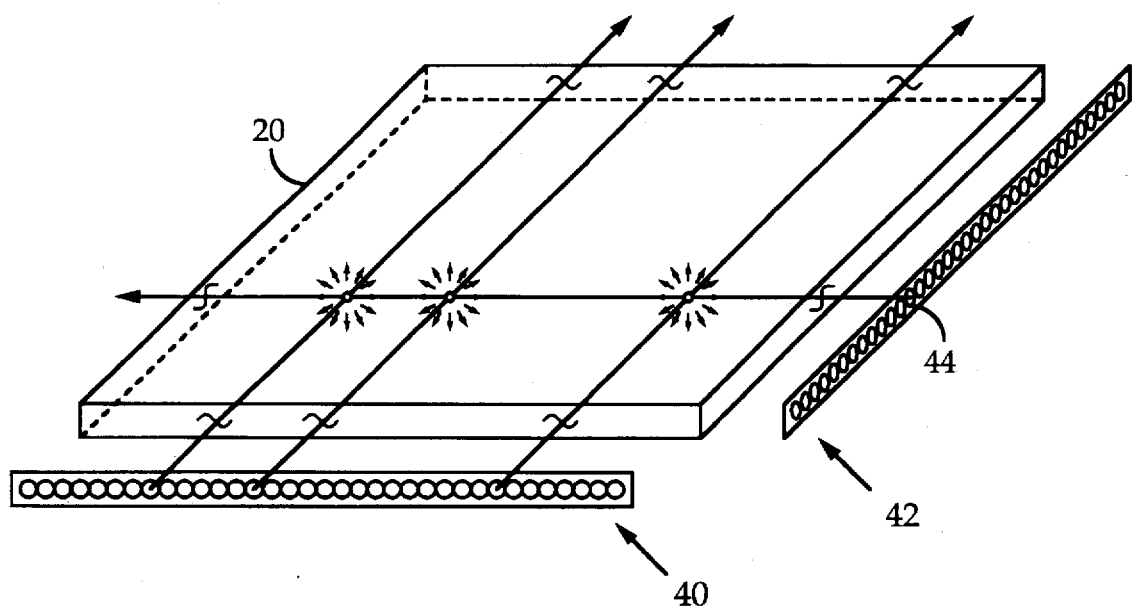
FIG. 10 illustrates independently addressable laser diode arrays being employed to address a display according to the invention.

FIG. 10 illustrates a system architecture in which deflective scanning of laser beams, and all of the associated positioning feedback and accuracy requirements, has been completely eliminated and replaced with linear arrays or vertical cavity surface emitting lasers (VCSELs) 40 and 42. Each individual emitter 44 on such an array is independently addressable and is simply modulated on or off to address pixels in the display volume. The arrays 40 and 42 are positioned on orthogonal faces of the display volume screen 20. Fixed micro lens arrays (not shown) are used to focus the beams from the diode arrays images are addressed via a computer or processor which modulates the appropriate emitters. This configuration has the advantage of reducing the laser power requirements to the minimum required to turn on one row of pixels the entire length of the image volume, as one emitter is employed for each row. Additionally, VCSELs can be grown in micro-clusters of different wavelengths allowing wavelength multiplexed addressing to be incorporated directly into this system. Each individual laser on a VCSEL array can be operated continuously (cw) or modulated at up to gigahertz frequencies. VCSELs are produced on individual chips whose dimensions and laser diode density (number of lasers per unit area) can be specified as needed for the resolution of the display.

D.3. Curved Two-Dimensional Displays

Figure 11:
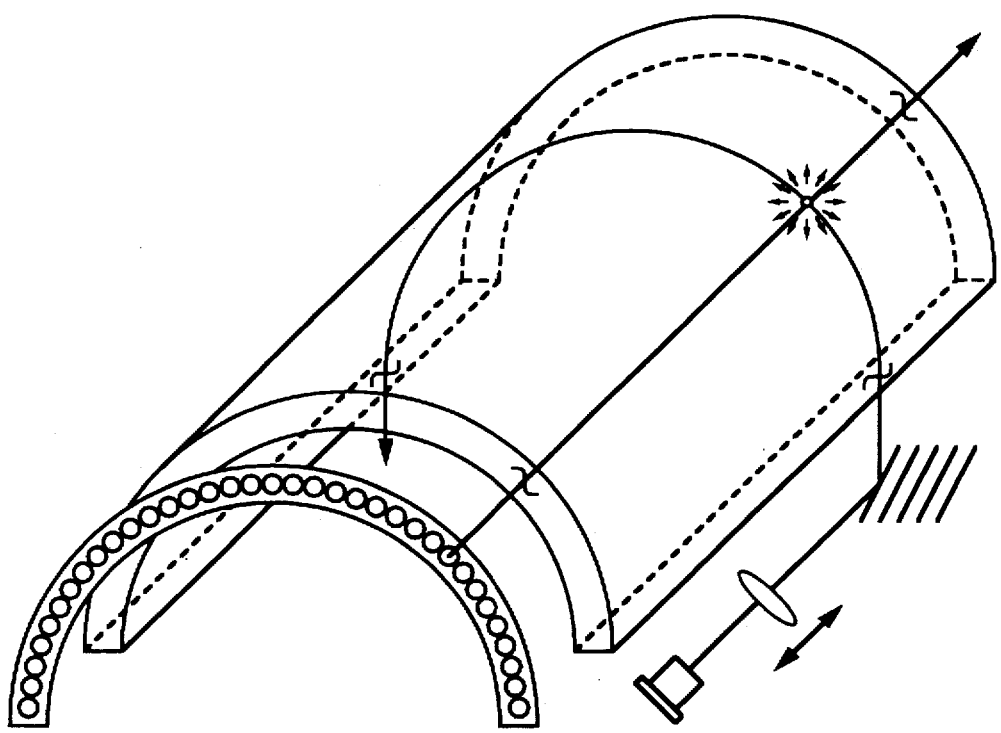
FIG. 11 illustrates a curved panel display according to the invention.

FIG. 11 shows a panel display in which curvature has been introduced. Curvature is possible because pump light that is launched into the active layer naturally propagates through the screen by total internal reflection (similar to the propagation of light through an optical fiber) and therefore does not leak out as the display surface curves. The display panel may have multiple degrees of curvature and may also undergo some degree of dynamic deflection while still functioning properly. The embodiment shown in FIG. 11 employs a combination of a laser array on one axis with a laser beam scanner for the other axis. As with the other embodiments, scanners and arrays may be used independently or in combination with each other or similar devices for launching beams into the display screen.

A computer or processor for storage and computation of an image database, and control of all deflection and modulation hardware, is implicit in the operation of the present invention. It will be evident to a person of ordinary skill in the art how known methods and devices may be adapted to control the operation of displays according to the present invention.

The foregoing description is offered for illustrative purposes only. Numerous modifications and variations may be readily apparent to those skilled in the art, while still falling within the spirit and scope of the invention as claimed herein below.

I claim:

1. A display comprising:
   a screen comprising a first layer of a first low phonon optically transparent host material doped with a first active ion species;
   a first infrared light source adapted to generate a first beam of photons having a first wavelength, and to direct the first beam into the first layer through an edge surface of the first layer; and
   a second infrared light source adapted to generate a second beam of photons having a second wavelength not equal to the first wavelength, and to direct the second beam into the first layer through an edge surface of the first layer;
   wherein the first active ion species has a ground state, an intermediate state, and an excited state such that photons having the first wavelength excite the first active ion from the ground state to the intermediate state, photons having the second wavelength excite the first active ion from the intermediate state to the excited state, and wherein relaxation from the excited state to the ground state produces visible fluorescence.

2. The display according to claim 1, wherein said host material is a heavy metal halide glass selected from the group consisting of the heavy metal halide glasses based on zirconium, hafnium, cadmium, indium, and zinc.

3. The display according to claim 1, wherein said host material is the heavy metal halide glass ZBLAN.

4. The display according to claim 1, wherein said host material is a chalcogenide material.

5. The display according to claim 4, wherein said chalcogenide optically transparent host material is a chalcogenide material based on sulfides of the 3rd and 4th group elements of the periodic table.

6. The display according to claim 1, wherein said low-phonon material is an alkali-metal halide crystal selected from the group consisting of halide crystals of NaCl, KCl, KBr, CsBr and CsI.

7. The display according to claim 1, wherein said low-phonon material is a nano-structured composite material.

8. The display according to claim 1, wherein said low-phonon material is a nano-phase material.

9. The display according to claim 1, wherein said low-phonon material is a doped aprotic polymer.

10. The display according to claim 1, wherein said low-phonon material has phonon energies of less than 500 $cm^{-1}$.

11. The display according to claim 1, wherein the first infrared light source comprises a laser and a single axis scanner.

12. The display according to claim 11, wherein the second infrared light source comprises a laser and a single axis scanner.

13. The display according to claim 11, wherein the second infrared light source comprises an array of laser diodes.

14. The display according to claim 1, wherein the first infrared light source comprises an array of laser diodes.

15. The display according to claim 14, wherein the second infrared light source comprises an array of laser diodes.

16. The display according to claim 14, wherein the second infrared light source comprises a slab laser diode.

17. The display according to claim 1, wherein the screen has a substantial curvature.

18. The display according to claim 1, wherein the first active ion species is a rare earth ion species.

19. The display according to claim 1, wherein the first active ion is selected from the group consisting of $Pr^{3+}$, $Er^{3+}$ and $Tm^{3+}$.

20. The display according to claim 1, further comprising:
- a third infrared light source adapted to generate a third beam of photons having a third wavelength different from both the first wavelength and the second wavelength, and to direct the third beam into the first layer through an edge surface of the first layer;
- wherein the first active ion species has a second excited state such that photons having the third wavelength excite the first active ion from the intermediate state to the second excited state, and wherein relaxation from the second excited state to the ground state produces visible fluorescence.

21. The display according to claim 1, wherein the screen further comprises a second layer of a second low phonon optically transparent host material doped with a second active ion species.

22. The display according to claim 21, wherein the first and second active ion species are, respectively, $Er^{3+}$ and $Tm^{3+}$.

23. The display according to claim 21, wherein the screen further comprises a third layer of a third low phonon optically transparent host material doped with a third active ion species.

24. The display according to claim 23, wherein the first, second, and third active ion species are, respectively, $Pr^{3+}$, $Er^{3+}$ and $Tm^{3+}$, whereby red, green, and blue fluorescence is produced.

25. The display according to claim 1, wherein the first low phonon optically transparent host material is additionally doped with a secondary ion species which permits energy transfer from the intermediate level of the first active ion species.

26. The display according to claim 25, wherein the secondary ion species is $Yb^{3+}$.

27. The display according to claim 1, wherein the screen further comprises an active color filter layer.

28. The display according to claim 27, wherein the active ion species is $Pr^{3+}$.

29. A method for displaying a two-dimensional image, the method comprising:
- generating a first beam of photons having a first wavelength and a second beam of photons having a second wavelength different from the first wavelength;
- directing the first beam and the second beam into a screen through first and second edge surfaces of the screen, wherein the screen comprises a layer of low phonon optically transparent host material doped with an active ion species;
- producing at a point of intersection of the first and second beams a two-frequency upconversion of active ions, followed by visible fluorescence; and changing the point of intersection within the screen to form the image.

30. The method according to claim 29, wherein said host material is a heavy metal halide glass selected from the group consisting of the heavy metal halide glasses based on zirconium, hafnium, cadmium, indium, and zinc.

31. The method according to claim 29, wherein said host material is the heavy metal halide glass ZBLAN.

32. The method according to claim 29, wherein said host material is a chalcogenide material.

33. The method according to claim 32, wherein said chalcogenide optically transparent host material is a chalcogenide material based on sulfides of the 3rd and 4th group elements of the periodic table.

34. The method according to claim 29, wherein said low-phonon material is an alkali-metal halide crystal selected from the group consisting of halide crystals of NaCl, KCl, KBr, CsBr and CsI.

35. The method according to claim 29, wherein said low-phonon material is a nano-structured composite material.

36. The method according to claim 29, wherein said low-phonon material is a nano-phase material.

37. The method according to claim 29, wherein said low-phonon material is a doped aprotic polymer.

38. The method according to claim 29, wherein said low-phonon material has phonon energies of less than 500 $cm^{-1}$.

39. The method according to claim 29, wherein the directing step employs a single axis scanner.

40. The method according to claim 29, wherein the generating step employs a light source chosen from the group consisting of a light emitting diode, a laser diode, a slab laser, a laser diode array, and a vertical cavity laser diode array.

41. The method according to claim 29, wherein the screen has a substantial curvature.

42. The method according to claim 29, wherein the first active ion species is a rare earth ion species.

43. The method according to claim 29, wherein the first active ion is selected from the group consisting of $Pr^{3+}$, $Er^{3+}$ and $Tm^{3+}$.

44. The method according to claim 29, further comprising:
- generating a third beam of photons having a third wavelength different from both the first wavelength and the second wavelength;
- directing the third beam into the screen through a third edge surface of the screen; and
- producing at a point of intersection of the first and third beams a two-frequency upconversion of active ions, followed by visible fluorescence.

45. The method according to claim 29, wherein the screen further comprises a second layer of a second low phonon optically transparent host material doped with a second active ion species.

46. The method according to claim 45, wherein the first and second active ion species are, respectively, $Er^{3+}$ and $Tm^{3+}$.

47. The method according to claim 45, wherein the screen further comprises a third layer of a third low phonon optically transparent host material doped with a third active ion species.

48. The method according to claim 47, wherein the first, second, and third active ion species are, respectively, $Pr^{3+}$, $Er^{3+}$ and $Tm^{3+}$, whereby red, green, and blue fluorescence is produced.

49. The method according to claim 29, wherein the first low phonon optically transparent host material is additionally doped with a secondary ion species which permits energy transfer from the intermediate level of the first active ion species.

50. The method according to claim 49, wherein the secondary ion species is $Yb^{3+}$.

51. The method according to claim 29, wherein the screen further comprises an active color filter layer.

52. The method according to claim 51, wherein the active ion species is $Pr^{3+}$.

* * * * *